(12) United States Patent
Bouny

(10) Patent No.: US 7,772,925 B2
(45) Date of Patent: Aug. 10, 2010

(54) POWER AMPLIFIER WITH PRE-DISTORTER

(75) Inventor: Jean Jacques Bouny, Fontenilles (FR)

(73) Assignee: Freescale Semiconductor, Inc., Austin, TX (US)

( * ) Notice: Subject to any disclaimer, the term of this patent is extended or adjusted under 35 U.S.C. 154(b) by 119 days.

(21) Appl. No.: 12/295,462

(22) PCT Filed: Mar. 31, 2006

(86) PCT No.: PCT/EP2006/004037
§ 371 (c)(1),
(2), (4) Date: Sep. 30, 2008

(87) PCT Pub. No.: WO2007/112769
PCT Pub. Date: Oct. 11, 2007

(65) Prior Publication Data
US 2009/0322424 A1    Dec. 31, 2009

(51) Int. Cl.
*H03F 1/26* (2006.01)
(52) U.S. Cl. .................................... 330/149; 330/124 R
(58) Field of Classification Search ................. 330/149, 330/124 R, 295; 375/297; 455/114.3
See application file for complete search history.

(56) References Cited

U.S. PATENT DOCUMENTS

| 4,068,186 A | 1/1978 | Sato et al. |
| 4,992,754 A | 2/1991 | Blauvelt et al. |
| 5,576,660 A | 11/1996 | Pouysegur et al. |
| 6,864,742 B2 * | 3/2005 | Kobayashi ............... 330/124 R |
| 7,345,535 B2 * | 3/2008 | Kwon et al. ............. 330/124 R |

FOREIGN PATENT DOCUMENTS

| EP | 1030441 A2 | 8/2000 |
| EP | 1367711 A1 | 12/2003 |

* cited by examiner

*Primary Examiner*—Robert Pascal
*Assistant Examiner*—Hieu P Nguyen

(57) ABSTRACT

Amplifier apparatus comprising a power amplifier having an operating frequency in the radio frequency or microwave or higher ranges and a pre-distorter, the characteristics of the power amplifier comprising a distortion from a linear transfer function. The pre-distorter comprises a non-linear path and a linear path including amplifiers having substantially identical physical characteristics, an input divider responsive to an amplifier input signal for applying respective pre-distorter input signals to the paths, and an output coupler for combining the signals from the linear path and the non-linear path to produce a pre-distorted signal. The characteristics of the pre-distorter comprise a distortion relative to a linear transfer function that compensates for the distortion of the transfer function of the power amplifier.

20 Claims, 3 Drawing Sheets

POWER AMPLIFIER WITH PRE-DISTORTER

FIELD OF THE INVENTION

This invention relates to a power amplifier having an operating frequency in the radio frequency ('RF') or microwave or higher ranges, with a pre-distorter. Such a power amplifier is referred to below as a radio power amplifier.

BACKGROUND OF THE INVENTION

Radio power amplifiers are used in telecommunications, for example, both for transmission and for reception. To operate a power amplifier efficiently, with maximum power and gain, it is desirable to run it with bias voltage and input signal amplitude conditions such that it functions close to saturation, with the consequence that the linearity of its transfer function is degraded or distorted relative to an otherwise similar amplifier running further from saturation.

In order to compensate for the distortion, the amplifier is conveniently linearised by a pre-distorter, which should be simple to use and easy to integrate on the same semiconductor chip as at least initial stages of the main amplifier module, the so-called monolithic integrated circuit ('MIC') technology. Such a pre-distorter presents to the input signal of the amplifier a non-linear transfer function that tends to compensate the non-linearities in the operation of the power amplifier module. The pre-distorter comprises a scaled amplifier of the same physical characteristics, in particular the same technology and process of manufacture as the amplifier to linearise, whose component elements are easy to integrate and which will require a low number of tuning operations.

Many ways of building pre-distorters have already been described and many of them use a "linear/non-linear path" topology. One linear/non-linear path topology is described in patent specification U.S. Pat. No. 4,992,754 and comprises a first path providing a copy of the input signal (linear path) and a second path in which some distortion is introduced through a non-linear device (non-linear path). The difference between the signals from the two paths contains a distortion that is arranged to be in opposition with the distortion of the power amplifier to linearise, in order to cancel out the distortion introduced by the power amplifier.

One limitation of that system is that some delay must be introduced in the linear path to compensate for the delay in the non-linear path, and the relationship between the two paths in phase and amplitude is not easily maintained with frequency and from part to part. Another limitation is in the couplers, which may be well suited for hybrid technology but which are not easy to integrate, especially on semiconductor material such as Silicon where transmission lines are lossy.

U.S. Pat. No. 5,576,660 describes a pre-distorter that comprises a 90° input divider and a 90° output coupler in hybrid form, the circuits of the two channels (or paths) being interconnected by micro strip circuits or by hybrid techniques, and it cannot readily be implemented in integrated circuits. The two paths of the pre-distorter include microwave amplifiers, attenuators and variable phase shifters that are adjusted to adapt the transfer characteristics to a power amplifier of different technology. From the user point of view, numerous tuning operations are necessary in order to optimise the linearity of this system. Phase and gain need to be adjusted in each path to adjust the shape of the gain and phase pre-distortion curves. The bias voltages of all the active devices used in both paths need to be adjusted, and also the total gain of the pre-distorter to adjust its level characteristic to that of the power amplifier (the level at which the amplifier will start to introduce distortion).

The present inventor's previous patent specification EP 022 913 305 describes a pre-distorter that is integrated in MIC technology and is more readily manufactured and tuned. However, it is still desirable to improve the characteristics relating to variability of resistors and their non-linearity when used at high RF level, to simplify further the tuning operations and to reduce further overall losses of the complete pre-distorter.

SUMMARY OF THE INVENTION

The present invention provides amplifier apparatus having an operating frequency in the radio frequency ('RF') or microwave or higher ranges and comprising a pre-distorter, as described in the accompanying claims.

DETAILED DESCRIPTION OF THE PREFERRED EMBODIMENTS

Figure 1:
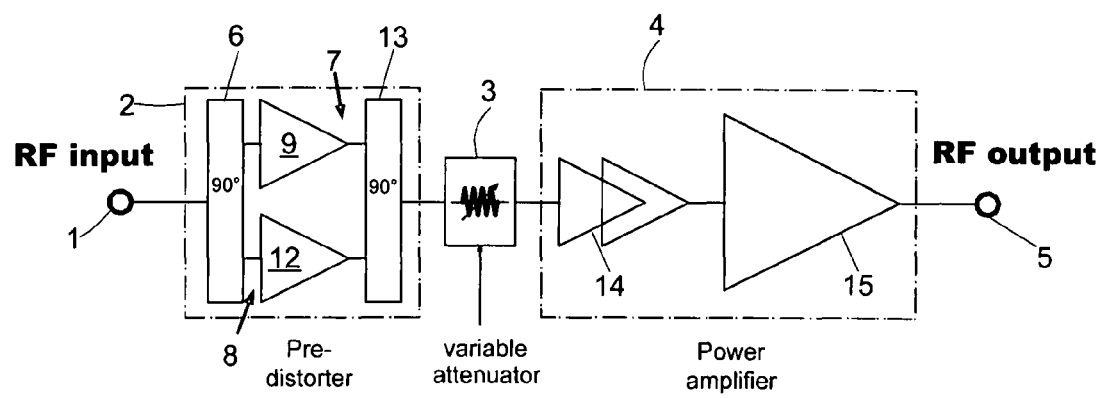
FIG. 1 is a schematic diagram of amplifier apparatus in accordance with one embodiment of the invention, given by way of example.

The amplifier apparatus shown in the drawings comprises an input terminal 1 for a radio frequency input signal, a pre-distorter 2 receiving the signal from the terminal 1, a variable attenuator 3 receiving an output signal from the pre-distorter 2 and a power amplifier 4 whose output signal is applied to an output terminal 5.

The pre-distorter 2 comprises an input divider 6 that divides the input signal from the terminal 1 into two signals of equal amplitude, which are applied respectively to a relatively high gain non-linear path 7 operating relatively close to saturation, similar to the operating conditions of said power amplifier, and a relatively low gain linear path 8 operating at substantially more linear conditions. The divider 6 introduces a phase difference of 90° between the two signals applied to the paths 7 and 8 respectively. The non-linear path 7 comprises an amplifier 9 and the linear path 8 comprises an amplifier 12. The amplifiers 11 and 12 receive orthogonal signals from the divider 6 and have substantially identical physical characteristics. The paths 7 and 8 are connected to apply the orthogonal output signals of the amplifiers 11 and 12 to a combiner or coupler 13 that combines the signals from the two paths and introduces a further phase difference of 90° between the two signals from the paths 7 and 8 respectively before combining them in anti-phase, that is to say adding the signals together with 180° phase difference between the signals being combined. The coupler 13 applies the combined signal to the variable attenuator 3.

Figure 2:
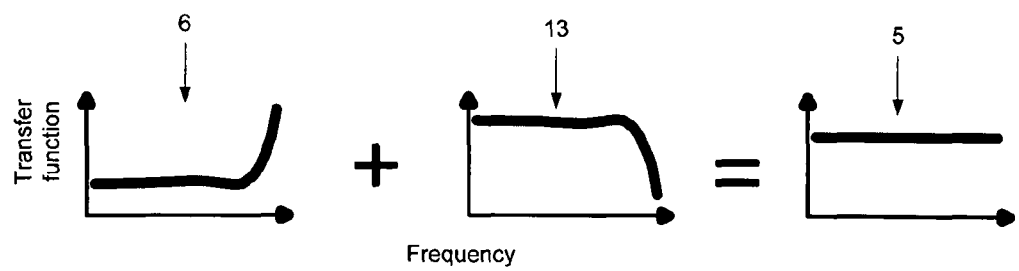
FIG. 2 is a diagram of the variation with frequency of transfer characteristics of divider and combiner elements in a pre-distorter of the amplifier apparatus of FIG. 1.
Figure 3:
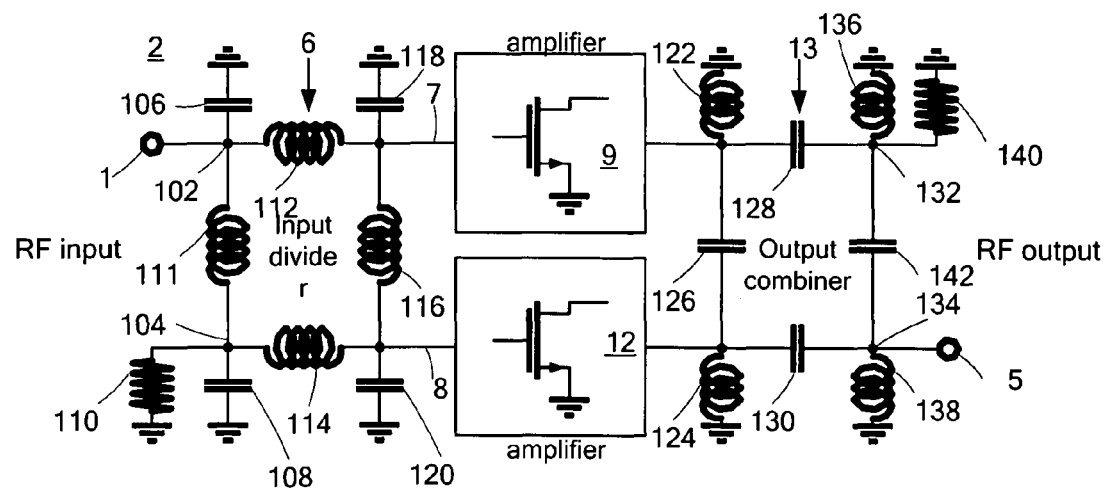
FIG. 3 is a more detailed schematic diagram of a pre-distorter in an embodiment of the amplifier apparatus of FIG. 1.

In one embodiment of the present invention, the divider 6 is arranged to have low pass characteristics and the coupler 13 is arranged to have high pass characteristics, as shown schematically in FIG. 2 of the accompanying drawings. A pre-distorter 2 of this type is shown in FIG. 3. In another embodiment of the present invention, whose pre-distorter 2 is shown in FIG. 4, the divider 6 is arranged to have high pass characteristics and the coupler 13 is arranged to have low pass characteristics.

Figure 4:
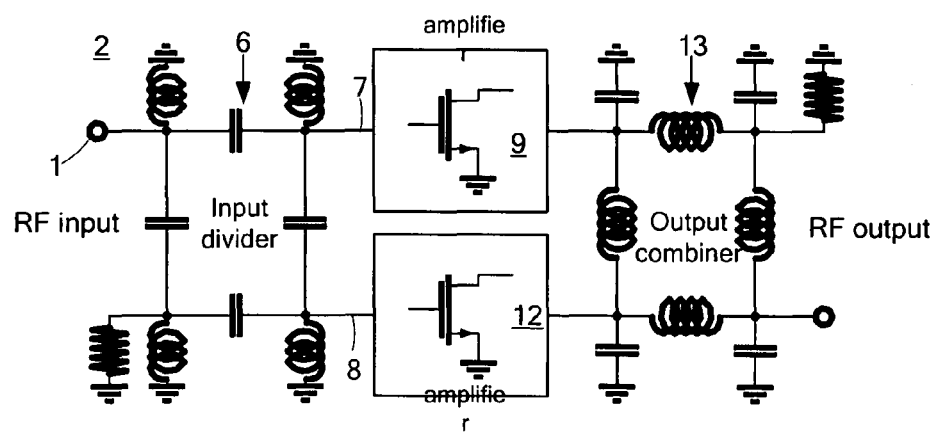
FIG. 4 is a more detailed schematic diagram of a pre-distorter in another embodiment of the amplifier apparatus of FIG. 1.

The 90° combiners and dividers used in the embodiments shown in FIGS. 3 and 4 comprise lossy lumped reactance elements, which have a natural tendency to be unbalanced, and advantage is taken of this unbalance to create a linear and non-linear path by having the two paths 7 and 8 of the otherwise balanced differential amplifier working at different levels. The unbalance between the input divider 6 and the output combiner 13 is arranged to be in the right direction so as to present transfer characteristics whose magnitudes and variations with frequency tend to compensate each other since, in the pre-distorter 2, the signals from the two paths 7 and 8 are subtracted instead of being added and since one of the divider and the combiner is high pass while the other is low pass. The overall transfer characteristics of the pre-distorter are therefore substantially linear with frequency, as shown in FIG. 2.

These topologies present a self-compensation effect reducing or avoiding need for gain and phase adjustment in each path 7 and 8 of the pre-distorter, and overall losses are minimized because there is no attenuator in the two paths 7 and 8 of the pre-distorter 2. By using the same type of device and process technology in the pre-distorter amplifiers 9 and 12 as in the main amplifier 15, the amplifiers present the same thermal behaviour, and there is no need to adjust the shape of the variation of the pre-distorter characteristics with temperature. The only adjustment required here is the attenuator 3 between the pre-distorter and the power amplifier that is to be linearised. It will be appreciated that for fine-tuning of the linearisation, the bias points of the amplifiers 7 and 8 can be adjusted but in most cases this is unnecessary.

The pre-distorter shown in FIG. 3 comprises a low pass input divider 6 comprising series inductive elements and a high pass output coupler 13 that comprises series capacitive elements. The input terminal 1 is connected to the path 7 at a connection point 102 and the path 8 starts at a connection point 104. Capacitors 106 and 108 are connected between the connection points 102 and 104 respectively and ground. A resistor 110 is also connected between the connection point 104 and ground. An inductor 111 is connected between connection points 102 and 104. Inductors 112 and 114 are connected in series in the paths 7 and 8 between the connection points 102 and 104 and the inputs of the amplifiers 9 and 12 respectively. An inductor 116 is connected across the inputs of the amplifiers 9 and 12. Capacitors 118 and 120 are connected between the inputs of the amplifiers 9 and 12 respectively and ground.

The output coupler 13 comprises inductors 122 and 124 that are connected between the outputs of the amplifiers 9 and 12 respectively and ground. A capacitor 126 is connected across the outputs of the amplifiers 9 and 12. Capacitors 128 and 130 are connected in series in the paths 7 and 8 between the outputs of the amplifiers 9 and 12 and connection points 132 and 134 respectively. Inductors 136 and 138 are connected between the connection points 132 and 134 respectively and ground. A resistor 140 is also connected between the connection point 132 and ground. A capacitor 142 is connected between the connection points 132 and 134. The pre-distorter output terminal 5 is connected to the connection point 134 in the path 8.

The pre-distorter shown in FIG. 3 does not have especially wide band characteristics but its bandwidth is sufficient for use in many telecommunications applications and especially in cellular telephone systems like 2.5 G or 3 G, where a 10% bandwidth is adequate (UMTS band around 2.1 GHz is 2.8%).

The embodiment of pre-distorter shown in FIG. 4 resembles that shown in FIG. 3 but the capacitive elements are replaced with inductive elements and vice-versa, so that the transfer characteristics of the input divider 6 are high pass and those of the output coupler 13 are low pass. In particular, the high pass input divider 6 comprising series capacitive elements and the low pass output coupler 13 comprises series inductive elements.

Figure 5:
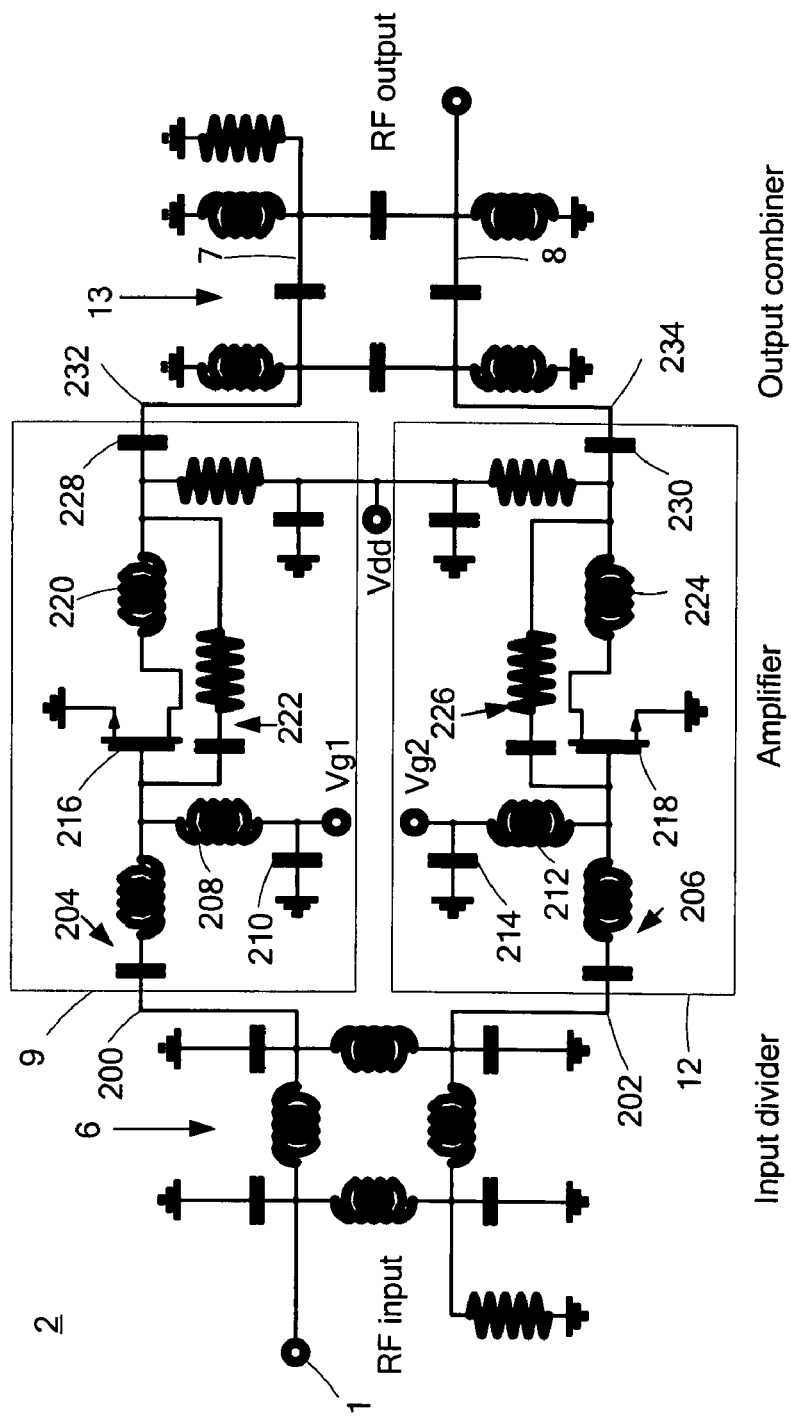
FIG. 5 is a more detailed schematic diagram of an embodiment of the pre-distorter of FIG. 3.

FIG. 5 shows an example of the amplifiers 9 and 12 in an embodiment of the kind shown in FIG. 3. The inputs 200 and 202 of the amplifiers are connected through combinations 204 and 206 of capacitors and inductors in series to gate terminals of field effect transistors ('FET') 216 and 218. The gate terminals of field effect transistors ('FET') 216 and 218 are supplied with gate bias voltage from terminals Vg1 and Vg2 through inductors 208 and 212, with decoupling capacitors 210 and 214 connected between terminals Vg1 and Vg2 respectively and ground. The sources of the FETs 216 and 218 are connected to ground while the drains are connected through inductors 220 and 222 to a voltage supply terminal Vdd and to the amplifier outputs 232 and 234 through capacitors 228 and 230. Feedback loops 222 and 224 extend from the connection of inductor 220 with capacitor 228 to the gate of FET 216 and from the connection of inductor 224 with capacitor 230 to the gate of FET 218.

The amplifiers 9 and 12 comprise transistors of smaller size than the transistors of the power amplifier 4 and, in particular, of smaller power capacity but otherwise of identical physical characteristics to the power amplifier transistors, being manufactured with the same technological process in the same manufacturing plant. In an embodiment of the present invention, the pre-distorter amplifiers 11 and 12 are integrated in the same integrated circuit as one or more initial stages of the power amplifier 4. It will be appreciated that these features simplify tuning the pre-distorter 2.

The non-linear path amplifier 9 is operated under conditions of bias and signal voltage that are substantially equal to those of the power amplifier 4. Accordingly, the distortion characteristics of the non-linear amplifier 9 are substantially identical to those of the power amplifier 4. The linear amplifier 12 is operated at a similar bias voltage but with a smaller signal voltage, so that the linear amplifier 12 operates substantially with optimally linear characteristics, its gain being otherwise substantially identical to that of the non-linear path amplifier 9.

In an embodiment of the invention, all the components of the pre-distorter 2 are formed in or on a common semiconductor substrate. Moreover, components of the power amplifier 4 are also formed in the same semiconductor substrate and, in particular, all the components of the variable attenuator 3 and of the first stage 14, the driver of the power amplifier, are formed in the same semiconductor substrate. All the components of the final stage 15 of the power amplifier are also formed in a common substrate, which can be the same as that of the pre-distorter if their relative sizes are compatible. The technology used in an embodiment of the invention for the common substrate(s) is monolithic microwave integrated circuit ('MMIC') technology. One embodiment of such an amplifier operates at a frequency of 2.14 GHz.

In an embodiment of the invention, each of the paths 7 and 8 presents an impedance of 100 ohms and the divider 6 presents an impedance of 50 ohms to the input terminal 1 and 100 ohms to each of the paths 7 and 8.

An additional drawback of certain previous pre-distorters is that they use small devices to create the non-linearities; these devices have very high input and output impedances and are not easy to match to the standard 50 Ohms impedance. The pre-distorter of this embodiment of the present invention is readily matched to the standard 50 Ohms impedance; linear path 8, and non-linear path 7, are individually matched to 100 Ohms, which means that input divider 6 and output coupler 13 do not provide any impedance transformation and accordingly have a wider bandwidth Since the transistors of the amplifiers 9 and 12 have identical physical characteristics to the corresponding transistors of the power amplifier 4, exactly the same kind of non-linearity is obtained, without phase or amplitude tuning in the two paths 7 and 8. Also, the thermal behaviour of the pre-distorter is similar to that of the power amplifier 4 and no adjustment of the characteristics with temperature is required.

It will be appreciated that the divider 6 and coupler 13 consist, basically, of low path and high path filters in the embodiment illustrated. Band path filters may be used instead if desired, provided complementary high and low pass characteristics are obtained in the operating bandwidth.

The invention claimed is:

1. Amplifier apparatus having an operating frequency in the radio frequency or microwave or higher ranges comprising:
a pre-distorter for a power amplifier, the characteristics of said power amplifier comprising a distortion from a linear transfer function, said pre-distorter comprising a first path including a first pre-distorter amplifier, a second path including a second pre-distorter amplifier, said first and second pre-distorter amplifiers having substantially identical physical characteristics, pre-distorter input means responsive to an input signal for applying respective first and second pre-distorter input signals to said first and second paths, and combining means for combining first and second path signals from said first and second paths to produce a pre-distorted signal, the transfer characteristics of said pre-distorter comprising a distortion relative to a linear transfer function such as to tend to compensate for the distortion of the transfer function of said power amplifier, wherein said input means and said combining means are each arranged to introduce substantially orthogonal relative phase shifts between said first and second paths, such that said first and second path signals are combined substantially in anti phase to produce said pre-distorted signal, one of said input means and said combining means presenting high-pass and the other low-pass transfer characteristics whose variations with frequency tend to compensate each other, and said power amplifier comprising at least one stage of similar technology and topology to said first and second pre-distorter amplifiers but of larger power capacity.

2. Amplifier apparatus as claimed in claim 1 and including said power amplifier connected to receive said pre-distorted signal.

3. Amplifier apparatus as claimed in claim 2, wherein said power amplifier is connected to receive said pre-distorted signal through a variable attenuator.

4. Amplifier apparatus as claimed in claim 1, wherein said input means and said combining means comprise reactive and resistive components introducing phase shifts of substantially 90° between said first and second path signals.

5. Amplifier apparatus as claimed in claim 4, wherein said input means and said combining means consist substantially of passive components.

6. Amplifier apparatus as claimed in claim 1, wherein said first pre-distorter amplifier is arranged to operate at non-linear conditions close to saturation, similar to the operating conditions of said power amplifier, and said second pre-distorter amplifier is arranged to operate at substantially more linear conditions.

7. Amplifier apparatus as claimed in claim 6, wherein said non-linear path amplifier is arranged to operate at conditions of bias voltage and signal amplitude substantially equal to those of at least a final stage of said power amplifier and said linear path amplifier is arranged to operate at smaller signal amplitude but at similar conditions of bias voltage.

8. Amplifier apparatus as claimed in claim 1, wherein substantially all the components of said pre-distorter are formed in or on a common semiconductor substrate.

9. Amplifier apparatus as claimed in claim 8, wherein components of said power amplifier are formed in said common semiconductor substrate.

10. Amplifier apparatus as claimed in claim 9, wherein substantially all the components of at least a first stage of said power amplifier are formed in said common semiconductor substrate.

11. Amplifier apparatus as claimed claim 1, wherein the outputs of said input means and the inputs of said combining means each present an impedance substantially matched to 100 Ohms, and the input of said input means and the output of said combining means each present an impedance substantially matched to 50 Ohms.

12. Amplifier apparatus as claimed in claim 2, wherein said input means and said combining means comprise reactive and resistive components introducing phase shifts of substantially 90° between said first and second path signals.

13. Amplifier apparatus as claimed in claim 3, wherein said input means and said combining means comprise reactive and resistive components introducing phase shifts of substantially 90° between said first and second path signals.

14. Amplifier apparatus as claimed in claim 2, wherein said first pre-distorter amplifier is arranged to operate at non-linear conditions close to saturation, similar to the operating conditions of said power amplifier, and said second pre-distorter amplifier is arranged to operate at substantially more linear conditions.

15. Amplifier apparatus as claimed in claim 3, wherein said first pre-distorter amplifier is arranged to operate at non-linear conditions close to saturation, similar to the operating conditions of said power amplifier, and said second pre-distorter amplifier is arranged to operate at substantially more linear conditions.

16. Amplifier apparatus as claimed in claim 2, wherein substantially all the components of said pre-distorter are formed in or on a common semiconductor substrate.

17. Amplifier apparatus as claimed in claim 3, wherein substantially all the components of said pre-distorter are formed in or on a common semiconductor substrate.

18. Amplifier apparatus as claimed in claim 4, wherein substantially all the components of said pre-distorter are formed in or on a common semiconductor substrate.

19. Amplifier apparatus as claimed claim 2, wherein the outputs of said input means and the inputs of said combining means each present an impedance substantially matched to 100 Ohms, and the input of said input means and the output of said combining means each present an impedance substantially matched to 50 Ohms.

20. Amplifier apparatus as claimed claim 3, wherein the outputs of said input means and the inputs of said combining means each present an impedance substantially matched to 100 Ohms, and the input of said input means and the output of said combining means each present an impedance substantially matched to 50 Ohms.

* * * * *